(12) United States Patent
Thorp et al.

(10) Patent No.: US 7,863,950 B2
(45) Date of Patent: *Jan. 4, 2011

(54) APPARATUS FOR ADAPTIVE TRIP POINT DETECTION

(75) Inventors: Tyler J. Thorp, Sunnyvale, CA (US); Mark G. Johnson, Los Altos, CA (US); Brent Haukness, Monte Sereno, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/752,807

(22) Filed: May 23, 2007

(65) Prior Publication Data

US 2007/0216448 A1    Sep. 20, 2007

Related U.S. Application Data

(63) Continuation of application No. 11/106,288, filed on Apr. 14, 2005, now Pat. No. 7,236,023.

(51) Int. Cl.
*H03L 7/00* (2006.01)

(52) U.S. Cl. .................................... 327/143; 327/81

(58) Field of Classification Search ............... 327/77, 327/78, 80, 81, 143
See application file for complete search history.

(56) References Cited

U.S. PATENT DOCUMENTS

| | | | | |
|---|---|---|---|---|
| 4,958,898 A | | 9/1990 | Friedman et al. | 350/96.14 |
| 6,079,121 A | * | 6/2000 | Khadkikar et al. | 34/528 |
| 6,125,022 A | | 9/2000 | Naura | 361/192 |
| 6,137,324 A | | 10/2000 | Chung | 327/134 |
| 6,559,995 B2 | * | 5/2003 | Tokita | 398/182 |
| 7,078,944 B1 | * | 7/2006 | Jenkins | 327/143 |
| 7,190,209 B2 | | 3/2007 | Kang et al. | |
| 7,236,023 B2 | * | 6/2007 | Thorp et al. | 327/143 |
| 2004/0263222 A1 | | 12/2004 | Tseng et al. | 327/143 |
| 2005/0073341 A1 | | 4/2005 | Lim | |
| 2005/0140406 A1 | | 6/2005 | Rizzo et al. | 327/143 |
| 2007/0222482 A1 | | 9/2007 | Thorp et al. | |

FOREIGN PATENT DOCUMENTS

| | | |
|---|---|---|
| TW | 488583 | 5/2002 |
| TW | 563129 | 11/2003 |
| WO | PCT/US2006/012248 | 8/2006 |

OTHER PUBLICATIONS

Notice of Allowance of U.S. Appl. No. 11/752,819 mailed Sep. 23, 2009.

(Continued)

*Primary Examiner*—Long Nguyen
(74) *Attorney, Agent, or Firm*—Dugan & Dugan, PC (57) ABSTRACT

Apparatus are described for providing an adaptive trip point detector circuit that receives an input signal at an input signal node and generates an output signal at an output signal node, the output signal changing from a first value to a second value when the input signal exceeds a trip point reference value. In particular, the trip point reference value is adjusted to compensate for variations in process or temperature.

39 Claims, 7 Drawing Sheets

OTHER PUBLICATIONS

Office Action of related U.S. Appl. No. 11/752,819 mailed Jan. 14, 2010.
Nov. 10, 2009 Response to Aug. 7, 2009 Office Action of related Chinese Patent Application No. 200680011696.1.
Office Action of related Chinese Patent Application No. 200680011696.1 issued Dec. 18, 2009.
Jan. 29, 2010 Response to Dec. 18, 2009 Office Action of related Chinese Patent Application No. 200680011696.1.
Apr. 13, 2010 Reply to Office Action of U.S. Appl. No. 11/752,819 mailed Jan. 14, 2010.
Third Office Action of related Chinese Patent Application No. 200680011696.1 issued Apr. 13, 2010.
Search Report of counterpart Taiwan Patent Application No. 095113525 issued Apr. 25, 2010.
Office Action of U.S. Appl. No. 11/752,819 mailed Aug. 20, 2010.
Aug. 23, 2010 Reply to Aug. 20, 2010 Office Action of U.S. Appl. No. 11/752,819.
International Preliminary Report on Patentability of International Application No. PCT/US2006/012248 dated Oct. 16, 2007.
Office Action of U.S. Appl. No. 11/752,819 mailed Mar. 2, 2009.
Office Action of U.S. Appl. No. 11/752,819 mailed Oct. 8, 2008.
Final Office Action of U.S. Appl. No. 11/752,819 mailed Jul. 24, 2008.
Office Action of U.S. Appl. No. 11/752,819 mailed Jan. 11, 2008.
Office Action of U.S. Appl. No. 11/106,288 mailed Nov. 2, 2006.
Notice of Allowance of U.S. Appl. No. 11/106,288 mailed Feb. 23, 2007.
Jan. 29, 2007 Reply to Nov. 2, 2006 Office Action of U.S. Appl. No. 11/106,288.
Jun. 2, 2009 Reply to Mar. 2, 2009 Office Action of U.S. App. No. 11/752,819.
Dec. 30, 2008 Reply to Oct. 8, 2008 Office Action of U.S. Appl. No. 11/752,819.
Sep. 22, 2008 Reply to Jul. 24, 2008 Final Office Action of U.S. Appl. No. 11/752,819.
Apr. 8, 2008 Reply to Jan. 11, 2008 Office Action of U.S. Appl. No. 11/752,819.
Office Action of Chinese Patent Application No. 200680011696.1 issued Aug. 7, 2009.
Notice of Allowance of Related U.S. Appl. No. 11/752,819 mailed Sep. 21, 2010.
Sep. 21, 2010 Reply to Jun. 1, 2010 Offfice Action of counterpart European Patent Application No. 06740364.2.

* cited by examiner

APPARATUS FOR ADAPTIVE TRIP POINT DETECTION

REFERENCE TO RELATED APPLICATIONS

This application is a continuation of U.S. patent application Ser. No. 11/106,288, filed 14 Apr. 2005, now U.S. Pat. No. 7,236,023, which is incorporated by reference herein in its entirety, and is related to U.S. patent application Ser. No. 11/752,819, entitled "Methods for Adaptive Trip Point Detection," which is filed concurrently herewith, and which is incorporated by reference herein in its entirety.

BACKGROUND

Most electronic circuits, such as integrated circuits, receive power from an externally-supplied power supply. For example, an electronic system may include a power supply (e.g., $V_{33}$) that supplies power to one or more integrated circuits included in the system. At system start-up, $V_{33}$ may start at an initial value (e.g., 0 volts), and then gradually increase to its full-scale value (e.g., 3.3 volts). Many integrated circuits, however, include chip configuration circuits or other circuits that require a minimum power supply voltage (e.g., 1.5 volts) for normal operation. If a power supply signal less than the minimum is applied to such configuration circuits, the chip may not operate properly. As a result, many integrated circuits use power-on reset ("POR") circuitry to sense the voltage level of the power supply signal, and generate a control signal that indicates when $V_{33}$ exceeds the minimum power supply voltage.

To accomplish this task, POR circuits typically compare the power supply signal with a reference signal that has a voltage level equal to the minimum power supply voltage, and generate a control signal that indicates when $V_{33}$ is greater than the reference voltage. If the reference signal is an external signal (i.e., off-chip) that is always available, this task is quite straightforward. In most instances, however, an external reference signal is not available, but instead must be generated internally. Previously known POR circuits typically generate such reference signals by using properties of semiconductor devices, such as the threshold voltages of transistors and diodes.

Figure 1:
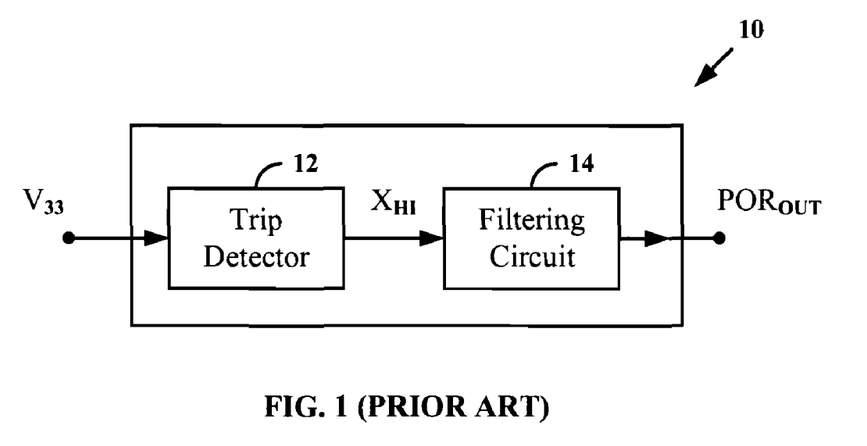
FIG. 1 is a diagram of a previously known power-on reset circuit.

For example, referring now to FIG. 1, a previously known POR circuit is described. POR circuit 10 includes trip detector circuit 12 and filtering circuit 14. Trip detector circuit 12 has an input coupled to $V_{33}$, and generates an output signal $X_{HI}$ that may be used to indicate when $V_{33}$ is greater than an internally-generated trip-point reference signal $V_{REF}$. Filtering circuit 14 smoothes and further processes signal $X_{HI}$, and generates an output control signal $POR_{OUT}$ that may be used to indicate when power supply signal $V_{33}$ is sufficiently high for normal circuit operation.

Figure 2:
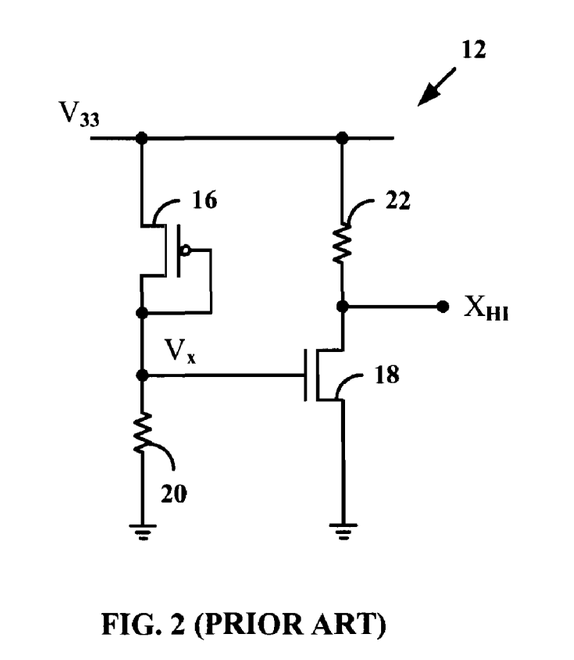
FIG. 2 is diagram of a previously known trip detector circuit.

Referring now to FIG. 2, an exemplary previously known trip detector circuit 12 is described. Trip detector circuit 12 includes diode-connected p-channel transistor 16 having its source terminal coupled to power supply $V_{33}$, and its drain and gate terminals coupled together at node $V_x$. Node $V_x$ also is coupled to ground via resistor 20, and to the gate of n-channel transistor 18. N-channel transistor 18 has its drain coupled to output node $X_{HI}$, which also is coupled to power supply $V_{33}$ via resistor 22. P-channel transistor 16 has a threshold voltage $V_{TP}$ having a nominal magnitude of about 0.8V, and n-channel transistor 18 has a threshold voltage $V_{TN}$ having a nominal value of about 0.8V. For simplicity, the symbol $V_{TP}$ will be used to refer to the magnitude of the threshold voltage of a p-channel transistor.

Figure 3:
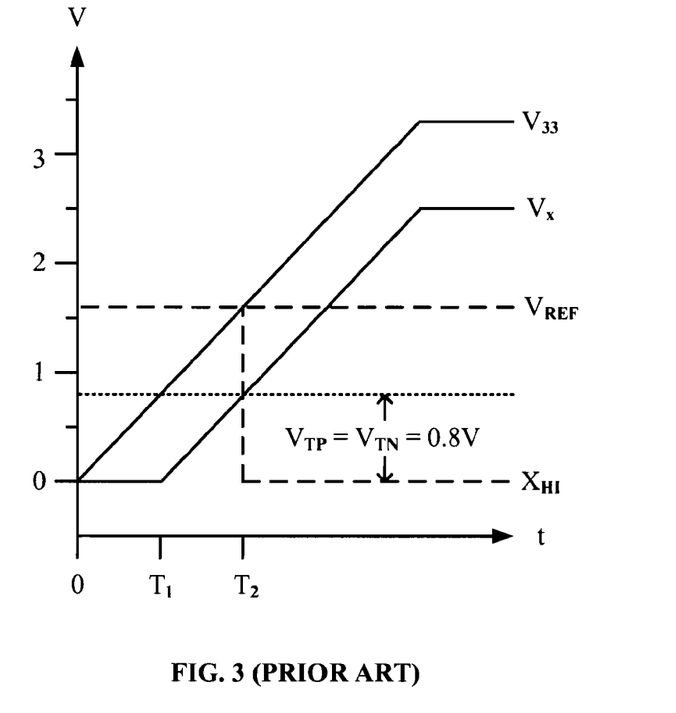
FIG. 3 is a diagram of signal response values of the circuit of FIG. 2.

Referring now to FIGS. 2 and 3, the operation of exemplary trip detector circuit 12 is described. In particular, FIG. 3 illustrates $V_{33}$, $V_x$ and $X_{HI}$ as a function of time. At t=0, $V_{33}$=0V, transistor 16 is OFF, and no current flows through resistor 20. As a result, $V_x$=0V, transistor 18 is OFF, no current flows through resistor 22, and $X_{HI}$=$V_{33}$=0V. For $0 \leq t \leq T_1$, $V_{33}$ increases, but remains below $V_{TP}$. As a result, transistor 16 remains OFF, and $V_x$=0. At t=$T_1$, $V_{33}$ exceeds $V_x$ by the threshold voltage $V_{TP}$, and transistor 16 begins to conduct. If resistor 20 is very large, the drain current of transistor 16 is very small, and $V_x$ remains one $V_{TP}$ below $V_{33}$. For $T_1 \leq t \leq T_2$, the voltage on node $V_x$ increases with increasing $V_{33}$, but remains below the threshold voltage $V_{TN}$ of transistor 18. Accordingly, transistor 18 remains OFF, no current flows through resistor 22, and thus $X_{HI}$=$V_{33}$. At t=$T_2$, $V_x$ is greater than $V_{TN}$, and transistor 18 begins to conduct. If resistor 22 is large, the drain current of transistor 18 is small, and transistor 18 pulls $X_{HI}$ to ground. Thus, $X_{HI}$ changes from a positive non-zero voltage to 0V when $V_{33}$ exceeds trip-point reference signal $V_{REF}$=$V_{TP}$+$V_{TN}$.

Threshold voltages $V_{TP}$ and $V_{TN}$, however, may vary significantly with variations in processing and temperature. For example, over normal process and temperature variations, threshold voltages $V_{TP}$ and $V_{TN}$ may have values between 0.6V to 1.2V. As a result, trip-point reference signal $V_{REF}$ may vary between $V_{REFL}$=1.2V to $V_{REFH}$=2.4V. For some circuit applications, such a wide variation in $V_{REF}$ may be unacceptable. For example, as described above, if a chip configuration circuit requires that $V_{33}$ be at least 1.5V, such a circuit may fail if threshold voltages $V_{TP}$ and $V_{TN}$ are low (e.g., $V_{TN}$=$V_{TP}$=0.6V, and thus $V_{REF}$=1.2V). Likewise, if threshold voltages $V_{TP}$ and $V_{TN}$ are both high (e.g., $V_{TN}$=$V_{TP}$=1.7V, and thus $V_{REF}$=3.4V), $X_{HI}$ may never change state, and thus the POR circuit would fail.

In view of the foregoing, it would be desirable to provide methods and apparatus that reduce the sensitivity of trip point detection circuits to process and temperature variations.

It also would be desirable to provide methods and apparatus that increase the trip point reference $V_{REF}$ of trip point detection circuits when transistor threshold voltages are lowered as a result of process or temperature conditions.

It additionally would be desirable to provide methods and apparatus that decrease the trip point reference $V_{REF}$ of trip point detection circuits when transistor threshold voltages are raised as a result of process or temperature conditions.

SUMMARY

Apparatus in accordance with this invention provide adaptive trip point detection circuits that adjust the trip point reference signal value to compensate for variations in process or temperature, without requiring an externally-supplied reference signal. In a first exemplary embodiment, a controlled current source is coupled to an internal node of a trip point detection circuit, and the controlled current source conducts a current that varies based on process and temperature conditions. For nominal or slow processes or nominal or low temperature conditions, the trip-point reference signal value equals a sum of two threshold voltages. For fast processes or high temperature conditions, in contrast, the trip-point reference signal value is increased.

In a second exemplary embodiment, a controlled current source is coupled to the output node of a trip point detection circuit, and the controlled current source conducts a current that varies based on process and temperature conditions. For nominal or slow processes or nominal or low temperature conditions, the trip-point reference signal value equals a sum of two threshold voltages. For fast processes or high temperature conditions, in contrast, the trip-point reference signal value is increased.

In a third exemplary embodiment, a first controlled current source is coupled to an internal node of a trip point detection circuit, a second controlled current source is coupled to an output node of the trip point detection circuit, and the first and second controlled current sources conduct currents that vary based on process and temperature conditions. For nominal or slow processes or nominal or low temperature conditions, the trip-point reference signal value equals a sum of two threshold voltages. For fast processes or high temperature conditions, in contrast, the trip-point reference signal value is increased.

In a fourth exemplary embodiment a first transistor having a nominal threshold voltage and a second transistor having a high threshold voltage are coupled to an output node of a trip point detection circuit, and the first and second transistors are switched in or out of the trip point detector circuit based on process and temperature conditions. For nominal or slow processes or nominal or low temperature conditions, the first transistor is switched into the trip point detector circuit. For fast processes or high temperature conditions, in contrast, the second transistor is switched into the trip point detector circuit.

BRIEF DESCRIPTION OF THE DRAWINGS

The above-mentioned objects and features of the present invention can be more clearly understood from the following detailed description considered in conjunction with the following drawings, in which the same reference numerals denote the same elements throughout, and in which.

DETAILED DESCRIPTION

The present invention provides methods and apparatus that reduce the sensitivity of trip point detection circuits to process and temperature variations. In some embodiments, methods and apparatus in accordance with this invention increase the trip point reference $V_{REF}$ when transistor threshold voltages are lowered as a result of process or temperature conditions. In other embodiments, methods and apparatus in accordance with this invention decrease the trip point reference $V_{REF}$ when transistor threshold voltages are raised as a result of process or temperature conditions. As used herein, a semiconductor process is characterized as "nominal," "slow" or "fast," based on the value of transistor threshold voltages produced by the process. In particular, a process is characterized as nominal, slow or fast if the transistors produced by the process have nominal, high or low threshold voltages, respectively.

Persons of ordinary skill in the art will understand that because p-channel and n-channel transistors are produced by different process steps, the threshold voltages of p-channel and n-channel transistors may not necessarily track one another. Thus, wafers produced by a single process may have "slow" p-channel transistors and "fast" n-channel transistors. As a result, methods and apparatus in accordance with this invention may adjust the trip point reference $V_{REF}$ based on detecting process-induced shifts in the threshold voltages of p-channel transistors only, n-channel transistors only, or both p- and n-channel transistors.

Figure 4:
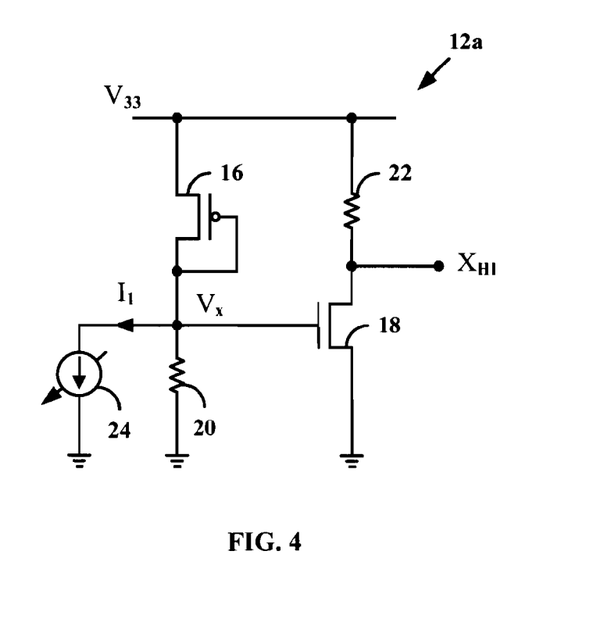
FIG. 4 is a diagram of an exemplary trip-point detector circuit in accordance with this invention.

Referring now to FIG. 4, an exemplary trip point detector circuit in accordance with this invention is described. Trip point detector circuit 12a includes the same circuit elements as trip point detector circuit 12 of FIG. 2, but also includes controlled current source 24 coupled between node $V_x$ and ground. As described in more detail below, controlled current source 24 conducts a current $I_1$ that varies based on process and temperature conditions. The following table illustrates an exemplary output response of controlled current source 24 as a function of process and temperature conditions:

TABLE 1

| Process/Temperature | $I_1$ |
| --- | --- |
| slow process or low temperature | 0 |
| nominal process or nominal temperature | 0 |
| fast process or high temperature | >0 |

That is, for slow or nominal processes, or low or nominal temperature, controlled current source 24 conducts no current. As a result, controlled current source 24 is effectively disconnected from node $V_x$, and trip point detector circuit 12a behaves like previously known trip point detector circuit 12 of FIG. 2. In contrast, for fast processes or high temperature, controlled current source 24 conducts current $I_1>0$, and effectively increases trip point reference signal $V_{REF}$.

Figure 5:
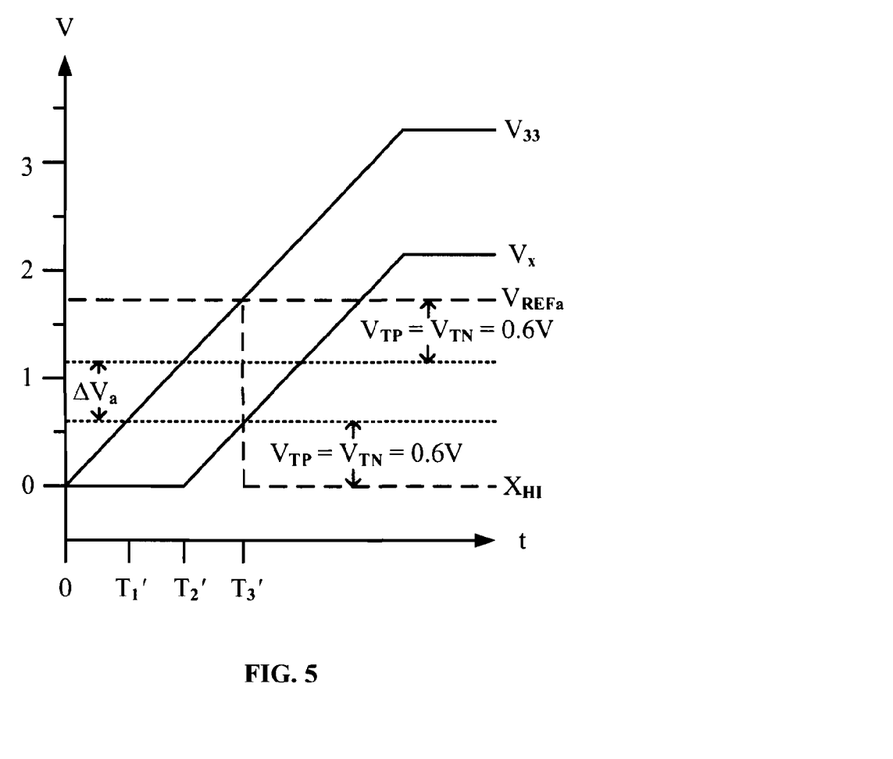
FIG. 5 is a diagram of signal response values of the circuit of FIG. 4.

Referring now to FIGS. 4 and 5, the operation of trip detector circuit 12a is described for fast processes or high temperature conditions that result in low threshold voltages (e.g., $V_{TN}$=0.6V or $V_{TP}$=0.6V). Persons of ordinary skill in the art will understand that threshold voltages $V_{TN}$ and $V_{TP}$ may not necessarily have equal values, and that methods and apparatus in accordance with this invention do not require that the two threshold voltages be equal. At t=0, $V_{33}$=0V, transistor 16 is OFF, and no current flows through resistor 20. As a result (assuming $V_x$ cannot go below ground), $V_x$=0V, transistor 18 is OFF, no current flows through resistor 22, and $X_{HI}$=$V_{33}$=0V. For 0≦t<$T_1'$, $V_{33}$ increases, but remains below $V_{TP}$. As a result, transistor 16 remains OFF, and $V_x$=0. At t=$T_1'$, $V_{33}$ exceeds $V_x$ by the threshold voltage $V_{TP}$, and transistor 16 begins to conduct. Because resistor 20 is large, transistor 16 tries to supply almost all of current I$_1$ required by controlled current source 24. As a result, V$_x$ remains at ground.

For T$_1$'≦t<T$_2$', V$_{33}$ increases, but V$_x$ remains at ground as transistor 16 continues to try to supply current I$_1$. At t=T$_2$', transistor 16 is fully saturated, which occurs at a V$_{33}$ value of:

$$V_{33} = |V_{GS}| = V_{TP} + \Delta V_a \quad (1)$$

where ΔV$_a$ is given by:

$$\Delta V_a = \sqrt{\frac{2I_1}{\beta_{16}}} \quad (2)$$

$$\beta_{16} = \left(\frac{W}{L}\right)_{16} \frac{\mu C_{ox}}{2} \quad (3)$$

where $$\left(\frac{W}{L}\right)_{16}$$

is the ratio of the width to length of transistor 16, μ is a constant and C$_{ox}$ is a process parameter.

For T$_2$'≦t<T$_3$', V$_x$ continues to track V$_{33}$, but remains below the threshold voltage V$_{TN}$ of transistor 18. Accordingly, transistor 18 remains OFF, and X$_{HI}$=V$_{33}$. At t=T$_3$', when V$_x$ equals V$_{TN}$, transistor 18 turns ON, and pulls X$_{HI}$ to ground. In this example, X$_{HI}$ changes from a positive non-zero voltage to 0V when V$_{33}$ exceeds trip-point reference signal V$_{REFa}$=V$_{TP}$+V$_{TN}$+ΔV$_a$. Thus, trip point detector circuit 12a has a trip-point reference signal V$_{REFa}$ that adapts to process and temperature conditions, as indicated in the following table:

TABLE 2

| Process/Temperature | V$_{REFa}$ |
|---|---|
| slow process or low temperature | V$_{TP}$ + V$_{TN}$ |
| nominal process or nominal temperature | V$_{TP}$ + V$_{TN}$ |
| fast process or high temperature | V$_{TP}$ + V$_{TN}$ + ΔV$_a$ |

For nominal or slow processes or nominal or low temperature conditions (i.e., when threshold voltages V$_{TN}$ and V$_{TP}$ are nominal or high), trip-point reference signal V$_{REFa}$ equals the sum of threshold voltages V$_{TN}$ and V$_{TP}$. However, for fast processes or high temperature conditions (i.e., when threshold voltages V$_{TN}$ and V$_{TP}$ are low), trip-point reference signal V$_{REFa}$ equals the sum V$_{TN}$+V$_{TP}$+ΔV$_a$.

Figure 6:
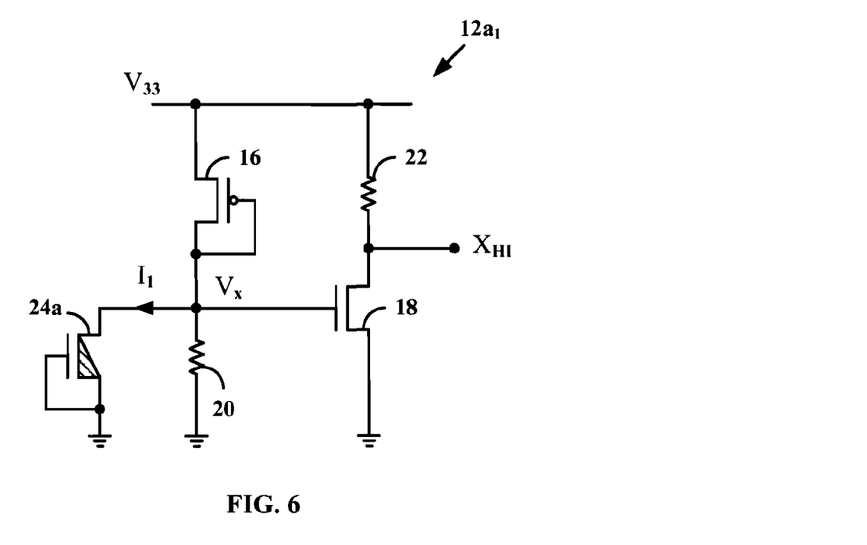
FIG. 6 is a diagram of an exemplary implementation of the circuit of FIG. 4.

Controlled current source 24 may be implemented using any circuit that has an output current that varies with process and temperature as shown in Table 1. Referring now to FIG. 6, an exemplary embodiment of such a circuit is described. In particular, trip point detector circuit 12a$_1$ includes native n-channel transistor 24a having its drain terminal coupled to node V$_x$, and its gate and source terminals coupled to ground. Native n-channel transistor 24a, sometimes referred to as a depletion-mode transistor, has a threshold voltage V$_{TZ}$ having a nominal value of approximately 0V. If native n-channel transistor 24a is fabricated on the same die as n-channel transistor 18, the threshold voltage of both transistors often will track with temperature conditions and n-channel process conditions, as illustrated in the following table:

TABLE 3

| N-Process/Temperature | V$_{TN}$ | V$_{TZ}$ |
|---|---|---|
| slow process or low temperature | high | high |
| nominal process or nominal temperature | nominal | nominal |
| fast process or high temperature | low | low |

Thus, if V$_{TZ}$ has a nominal value of 0V, for nominal or low temperatures, or slow or nominal n-processes, native n-channel transistor 24a never turns ON because the transistor's gate-to-source voltage V$_{GS}$=0. Under such conditions, trip point detector circuit 12a$_1$ behaves like trip point detector circuit 12 of FIG. 2. However, for fast n-processes or high temperatures, V$_{TZ}$ is less than 0V, and native n-channel transistor 24a turns ON when V$_x$ is above 0V. Thus, native n-channel transistor 24a acts like a controlled current source whose current varies with n-process and temperature conditions, as in Table 1, above. As a result, trip point detector circuit 12a$_1$ has a trip-point reference signal V$_{REFa}$ that adapts to process and temperature conditions, as in Table 2, above. Persons of ordinary skill in the art will understand that trip point detector circuit 12a$_1$ alternatively may be configured to have a trip-point reference signal V$_{REFa}$ that adapts to p-process and temperature conditions.

Figure 7:
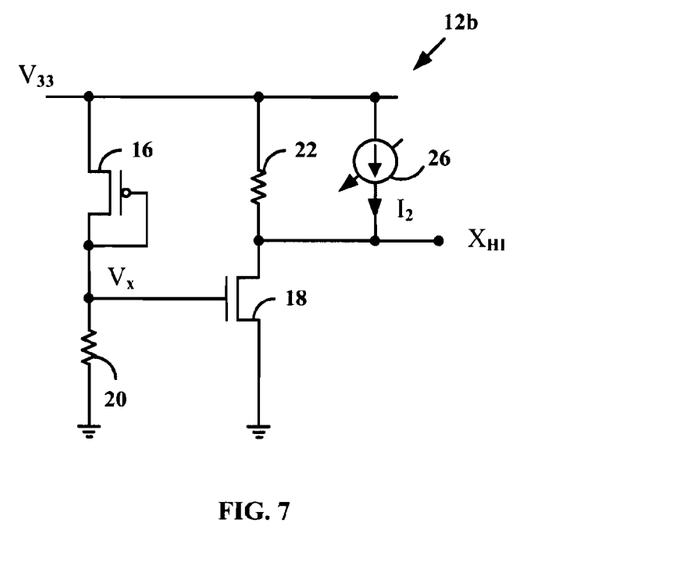
FIG. 7 is a diagram of an alternative exemplary trip-point detector circuit in accordance with this invention.

Referring now to FIG. 7, an alternative exemplary trip point detector circuit in accordance with this invention is described. Trip point detector circuit 12b includes the same circuit elements as trip point detector circuit 12 of FIG. 2, but also includes controlled current source 26 coupled between V$_{33}$ and node X$_{HI}$. As described in more detail below, controlled current source 26 conducts a current I$_2$ that varies based on process and temperature conditions. The following table illustrates an exemplary output response of controlled current source 26 as a function of process and temperature conditions:

TABLE 4

| Process/Temperature | I$_2$ |
|---|---|
| slow process or low temperature | 0 |
| nominal process or nominal temperature | 0 |
| fast process or high temperature | >0 |

That is, for slow or nominal processes, or low or nominal temperature, controlled current source 26 conducts no current. As a result, controlled current source 26 is effectively disconnected from node X$_{HI}$, and trip point detector circuit 12b operates like previously known trip point detector circuit 12 of FIG. 2. In contrast, for fast processes or high temperature, controlled current source 26 conducts current I$_2$>0, and effectively increases trip point reference signal V$_{REF}$.

Figure 8:
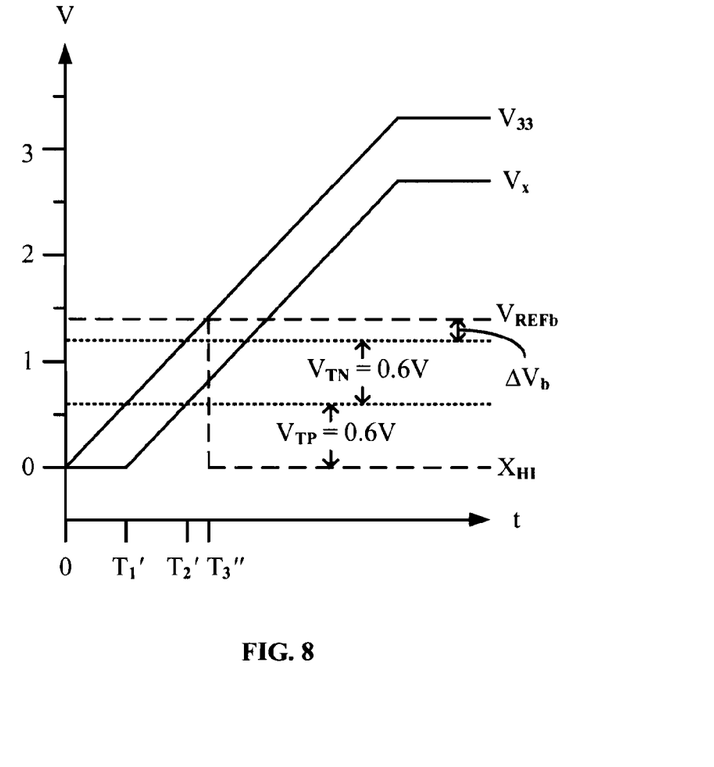
FIG. 8 is a diagram of signal response values of the circuit of FIG. 7.

Referring now to FIGS. 7 and 8, the operation of trip detector circuit 12b is described for fast processes or high temperature conditions that result in low threshold voltages (e.g., V$_{TN}$=0.6V or V$_{TP}$=0.6V). At t=0, V$_{33}$=0V, transistor 16 is OFF, V$_x$=0V, transistor 18 is OFF, and X$_{HI}$ equals V$_{33}$=0V. For 0≦t<T$_1$', V$_{33}$ increases, but remains below V$_{TP}$. As a result, transistor 16 remains OFF, V$_x$=0, and X$_{HI}$=V$_{33}$. At t=T$_1$', V$_{33}$ exceeds V$_x$ by the threshold voltage V$_{TP}$, and transistor 16 therefore begins to conduct.

For T$_1$'≦t<T$_2$', V$_x$ remains one V$_{TP}$ below V$_{33}$. Because V$_x$ is less than V$_{TN}$, transistor 18 remains OFF, and X$_{HI}$=V$_{33}$. At t=T$_2$', V$_{33}$=V$_{TP}$+V$_{TN}$, V$_x$=V$_{TN}$, and transistor 18 begins to conduct. However, a higher gate-to-source voltage is required to turn ON transistor 18 and sink the current I2 from controlled current source 26. As a result, $X_{HI}=V_{33}$. At $t=T_3''$, transistor 18 is fully saturated, and pulls $X_{HI}$ to ground. This occurs when $V_{33}$ has a value of:

$$V_{33}=V_{TP}+V_{GS18}=V_{TP}+(V_{TN}+\Delta V_b) \quad (4)$$

where $\Delta V_b$ is given by:

$$\Delta V_b = \sqrt{\frac{2I_2}{\beta_{18}}} \quad (5)$$

$$\beta_{18} = \left(\frac{W}{L}\right)_{18} \frac{\mu C_{ox}}{2} \quad (6)$$

where $$\left(\frac{W}{L}\right)_{18}$$

is the ratio of the width to length of transistor 18, $\mu$ is a constant and $C_{ox}$ is a process parameter. In this example, $X_{HI}$ changes from a positive non-zero voltage to 0V when $V_{33}$ exceeds trip-point reference signal $V_{REFb}=V_{TP}+V_{TN}+\Delta V_b$.

Thus, trip point detector circuit 12b has a trip-point reference signal $V_{REFb}$ that adapts to process and temperature conditions, as indicated in the following table:

TABLE 5

| Process/Temperature | $V_{REFb}$ |
|---|---|
| slow process or low temperature | $V_{TP}+V_{TN}$ |
| nominal process or nominal temperature | $V_{TP}+V_{TN}$ |
| fast process or high temperature | $V_{TP}+V_{TN}+\Delta V_b$ |

For nominal or slow processes or nominal or low temperature conditions (i.e., when threshold voltages $V_{TN}$ and $V_{TP}$ are nominal or high), trip-point reference signal $V_{REFb}$ equals the sum of threshold voltages $V_{TN}$ and $V_{TP}$. However, for fast processes or high temperature conditions (i.e., when threshold voltages $V_{TN}$ and $V_{TP}$ are low), trip-point reference signal $V_{REFb}$ equals the sum $V_{TN}+V_{TP}+\Delta V_b$.

Figure 9:
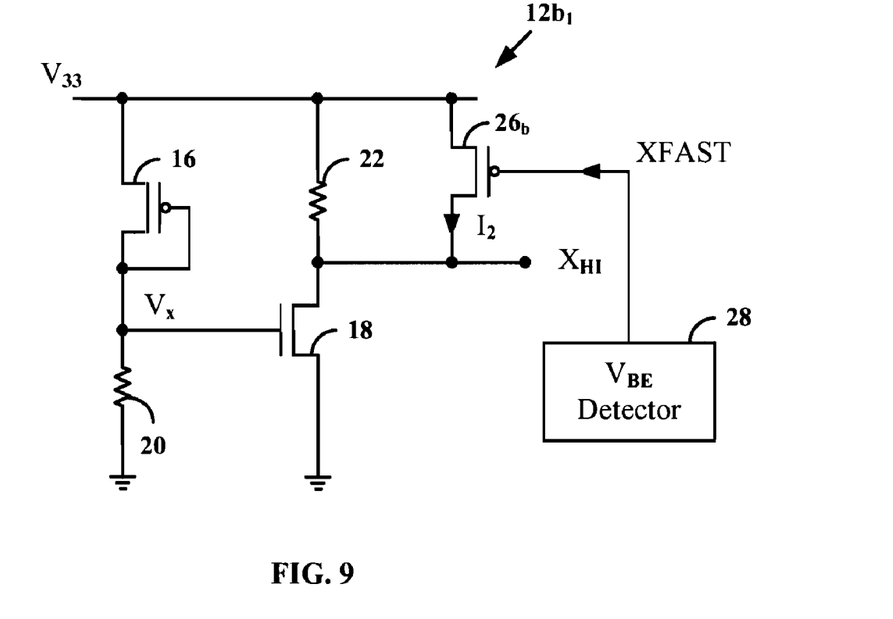
FIG. 9 is a diagram of an exemplary implementation of the circuit of FIG. 7.

Controlled current source 26 may be implemented using any circuit that has an output response as shown in Table 4. Referring now to FIG. 9, an exemplary embodiment of such a circuit is described. Trip point detector circuit 12b$_1$ includes p-channel transistor 26b having its drain terminal coupled to node $X_{HI}$, its gate terminal coupled to signal $X_{FAST}$, and its source terminal coupled to node $V_{33}$. As described in more detail below, $V_{BE}$ detector circuit 28 provides signal $X_{FAST}$ whose value depends on process and temperature conditions. In particular, for nominal or slow processes, or nominal or low temperatures, $X_{FAST}$ is HIGH, and transistor 26b is OFF. Under such conditions, trip point detector circuit 12b$_1$ behaves like trip point detector circuit 12 of FIG. 2. In contrast, for fast processes or high temperatures, $X_{FAST}$ is LOW, and transistor 26b injects current into node $X_{HI}$. Thus, transistor 26b acts like a controlled current source whose current varies with process and temperature conditions, as in Table 4, above. As a result, trip point detector circuit 12b$_1$ has a trip-point reference signal $V_{REFb}$ that adapts to process and temperature conditions, as in Table 5, above.

Figure 10:
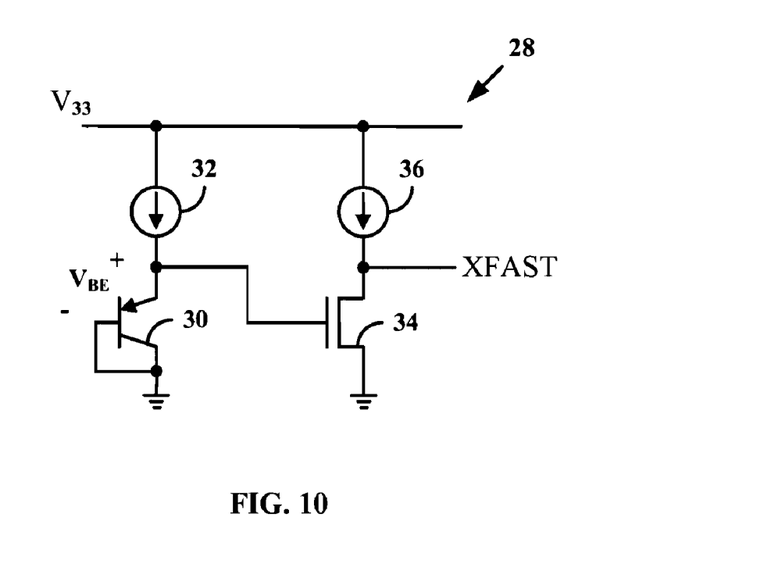
FIG. 10 is a diagram of an exemplary $V_{BE}$ detector circuit of FIG. 9.

Referring now to FIG. 10, an exemplary $V_{BE}$ detector circuit is described for generating $X_{FAST}$. In particular, $V_{BE}$ detector circuit 28 includes PNP transistor 30 having its base and collector terminals coupled to ground, and its emitter terminal coupled to $V_{33}$ via current source 32. The emitter terminal of PNP transistor 30 is also coupled to the gate of n-channel transistor 34, which has its source coupled to ground, and its drain terminal (node $X_{FAST}$) coupled to $V_{33}$ via current source 36. Thus, the base-emitter voltage of PNP transistor 30 equals the gate-source voltage of n-channel transistor 34.

The base-emitter voltage $V_{BE}$ of PNP transistor 30 and the threshold voltage $V_{TN}$ of n-channel transistor 34 tend to shift in the same direction with variations in n-process and temperature. However, variations in $V_{BE}$ typically are much less than variations in $V_{TN}$, and $V_{BE}$ typically remains very close to 0.7V. Thus, if $V_{TN}$ has a nominal value of 0.8V, for nominal or slow n-processes and nominal or low temperatures, $V_{BE}$ is less than $V_{TN}$. In contrast, for fast n-processes or high temperatures, $V_{BE}$ is greater than $V_{TN}$. Thus, for nominal or slow n-processes and nominal or low temperatures, the $V_{BE}$ of PNP transistor 30 is less than $V_{TN}$, transistor 34 is OFF, and $X_{FAST}$ is HIGH. In contrast, for fast n-processes or high temperatures, the $V_{BE}$ of PNP transistor 30 is greater than $V_{TN}$, transistor 34 is ON, and $X_{FAST}$ is LOW. Persons of ordinary skill in the art will understand that if $V_{TN}$ has a nominal value other than 0.8V, $V_{BE}$ may be compared to a scaled version of $V_{TN}$ to generate $X_{FAST}$. Persons of ordinary skill in the art will understand that $V_{BE}$ detector circuit 28 alternatively may be configured to provide a signal $X_{FAST}$ that varies based on p-process and temperature conditions.

Figure 11:
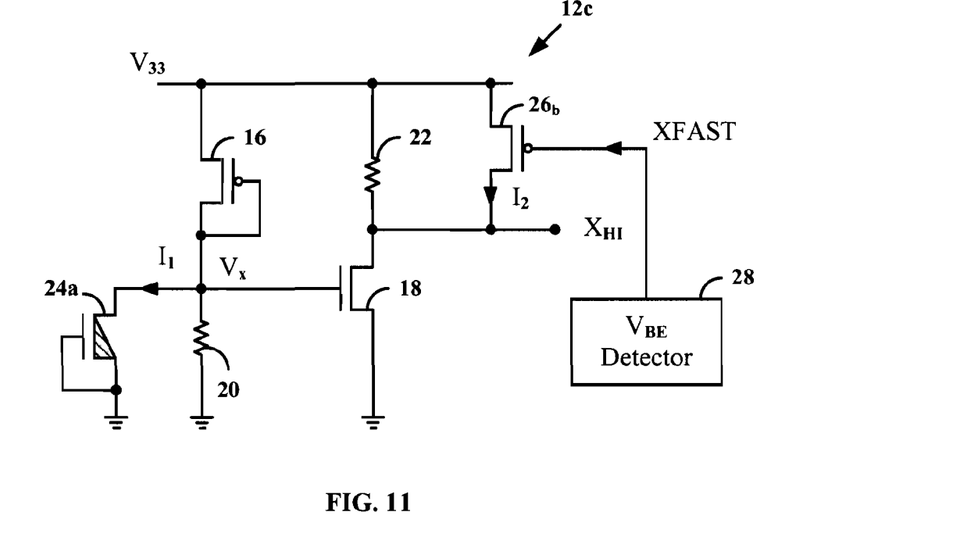
FIG. 11 is a diagram of another alternative exemplary trip-point detector circuit in accordance with this invention.
Figure 12:
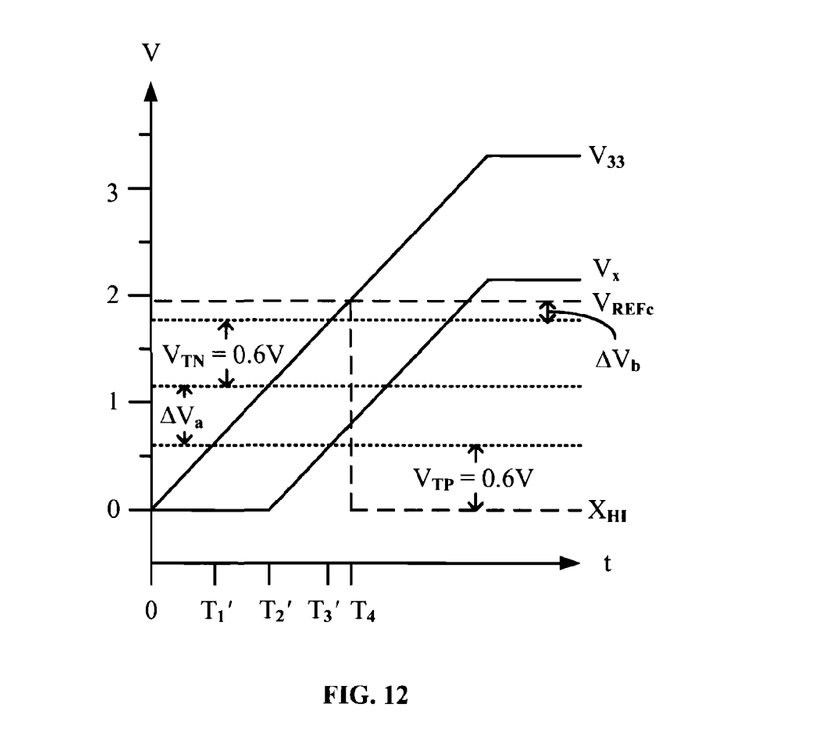
FIG. 12 is a diagram of signal response values of the circuit of FIG. 11.

Referring now to FIG. 11, another exemplary trip point detector circuit in accordance with this invention is described. In this example, the techniques illustrated in exemplary trip detector circuits 12a$_1$ and 12b$_1$ are combined. In particular, trip detector circuit 12c includes native n-channel transistor 24a coupled between node $V_x$ and ground, and p-channel transistor 26b coupled between $V_{33}$ and node $X_{HI}$. FIG. 12 illustrates the response of trip detector circuit 12c for fast processes or high temperature conditions that result in low threshold voltages (e.g., $V_{TN}=0.6V$ or $V_{TP}=0.6V$). Using an analysis similar to that described above, persons of ordinary skill in the art will understand that trip point detector circuit 12c has a trip-point reference signal $V_{REFc}$ that adapts to process and temperature conditions, as indicated in the following table:

TABLE 6

| Process/Temperature | $V_{REFc}$ |
|---|---|
| slow process or low temperature | $V_{TP}+V_{TN}$ |
| nominal process or nominal temperature | $V_{TP}+V_{TN}$ |
| fast process or high temperature | $V_{TP}+V_{TN}+\Delta V_a+\Delta V_b$ | where $\Delta V_a+\Delta V_b$ have values as specified in equations (2) and (3), and (5) and (6), respectively.

Figure 13:
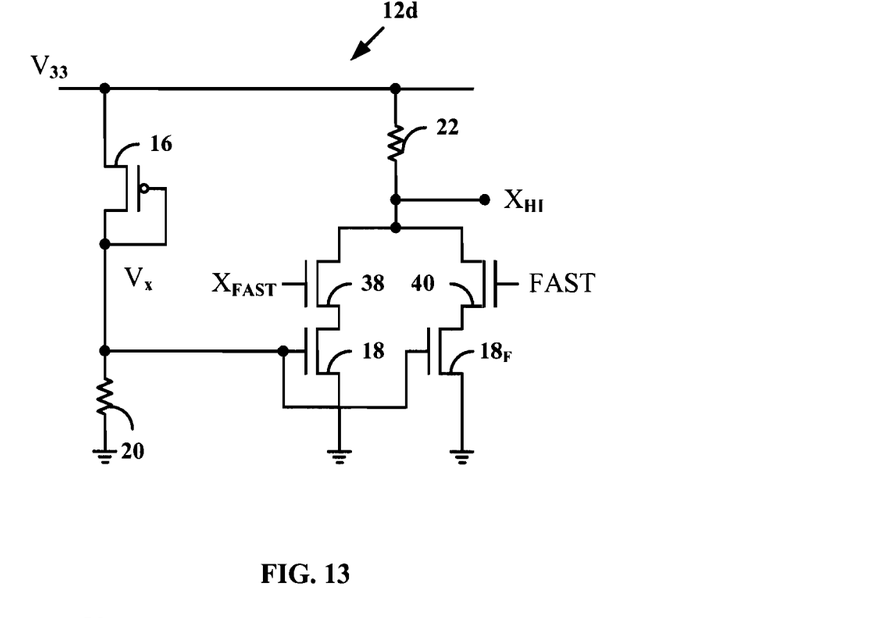
FIG. 13 is a diagram of still another alternative exemplary trip-point detector circuit in accordance with this invention.

Referring now to FIG. 13, another exemplary trip point detector circuit in accordance with this invention is described. In particular, trip point detector circuit 12d includes n-channel transistors 38 and 40 having drain terminals coupled to node $X_{HI}$, and source terminals coupled to the drain terminals of transistors 18 and 18F, respectively. In addition, transistor 38 has a gate terminal coupled to signal $X_{FAST}$, and transistor 40 has a gate terminal coupled to signal FAST (i.e., the logical inverse of $X_{FAST}$). Transistor 18F is similar to transistor 18, but has a higher nominal threshold voltage $V_{TNH}$ than the threshold voltage $V_{TN}$ of transistor 18. For example, if $V_{TN}$ has a nominal threshold voltage of 0.8V, $V_{THN}$ may have a nominal value of 1.0V. The difference in threshold values may be achieved, for example, by adjusting the dimensions of transistor 18F relative to the dimensions of transistor 18, or by adjusting the processing steps that affect the threshold voltages of the two transistors.

Transistors 38 and 40 are sized to operate as switches that alternately switch transistors 18 or 18F in or out of the circuit based on process and temperature conditions. In particular, for nominal or slow processes, or nominal or low temperatures, $X_{FAST}$ is HIGH, FAST is LOW, the drain of transistor 18 is coupled to node $X_{HI}$, and transistor 18F is effectively disconnected from the rest of the circuit. Under such conditions, trip point detector circuit 12d behaves like trip point detector circuit 12 of FIG. 2. In contrast, for fast processes or high temperatures, $X_{FAST}$ is LOW, FAST is HIGH, the drain of transistor 18F is coupled to node $X_{HI}$, and transistor 18 is effectively disconnected from the rest of the circuit. Thus, for fast processes or high temperatures, trip point detector circuit 12d swaps nominal threshold transistor 18 with high threshold transistor 18F.

If transistors 18 and 18F are fabricated on the same die, the threshold voltage of both transistors often will track with process and temperature conditions, an example of which is illustrated in the following table:

TABLE 7

| N-Process/Temperature | $V_{TN}$ | $V_{TNH}$ |
|---|---|---|
| slow process or low temperature | 1.0 | 1.2 |
| nominal process or nominal temperature | 0.8 | 1.0 |
| fast process or high temperature | 0.6 | 0.8 |

Figure 14:
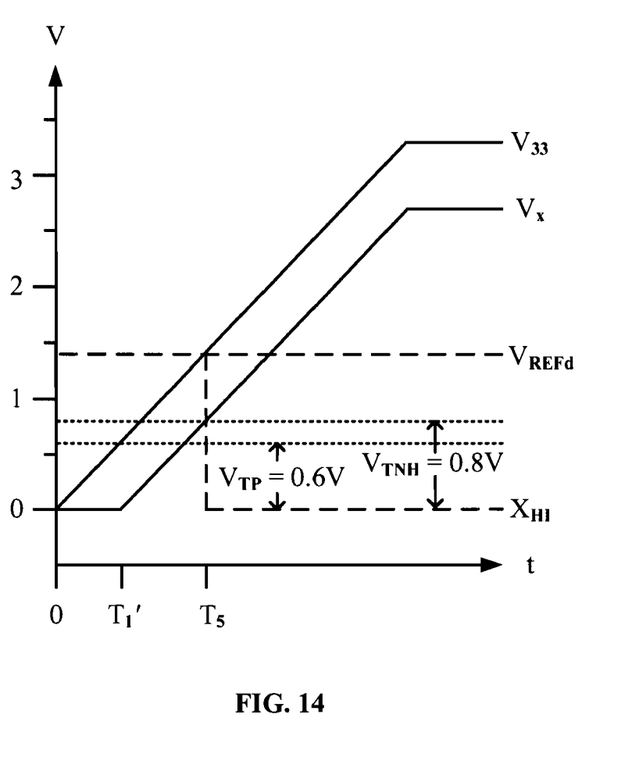
FIG. 14 is a diagram of signal response values of the circuit of FIG. 13.

Referring now to FIGS. 13 and 14, the operation of trip point detector circuit 12d is described for fast processes or high temperature conditions that result in low threshold voltages. In this example, $V_{TN}=V_{TP}=0.6V$, $V_{TNH}=0.8V$, $X_{FAST}$ is LOW, and FAST is HIGH. As a result, transistor 18 is effectively switched out of the circuit, and transistor 18 F is effectively switched into the circuit. At t=0, $V_{33}=0V$, transistor 16 is OFF, $V_x=0V$, transistor 18F is OFF, and $X_{HI}$ equals $V_{33}=0V$. For $0 \leq t < T_1'$, $V_{33}$ increases, but remains below $V_{TP}$. As a result, transistor 16 remains OFF, $V_x=0$, and $X_{HI}=V_{33}$. At $t=T_1'$, $V_{33}$ exceeds $V_x$ by the threshold voltage $V_{TP}$, and transistor 16 therefore begins to conduct. For $T_1' \leq t < T_5$, $V_X$ remains one $V_{TP}$ below $V_{33}$. Because $V_X$ is less than $V_{TNH}$, transistor 18F remains OFF, and $X_{HI}=V_{33}$. At $t=T_5$, $V_{33}=V_{TP}+V_{TNH}$, $V_x=V_{TNH}$, and transistor 18F turns ON and pulls $X_{HI}$ to ground. In this example, $X_{HI}$ changes from a positive non-zero voltage to 0V when $V_{33}$ exceeds trip-point reference signal $V_{REFd}=V_{TP}+V_{TNH}$.

The exemplary circuits described above illustrate techniques used to increase the trip point reference $V_{REF}$ when transistor threshold voltages are lowered as a result of process or temperature conditions. Persons of ordinary skill in the art will understand that methods and apparatus in accordance with this invention also may be used to decrease the trip point reference $V_{REF}$ when transistor threshold voltages are raised as a result of process or temperature conditions. For example, in trip point detector circuit $12_{b1}$ illustrated in FIG. 9, the gate of p-channel transistor $26_b$ may be coupled to a control signal SLOW that is LOW for nominal or fast processes, or nominal or high temperatures, and HIGH for slow processes or low temperature conditions. In that regard, current $I_2$ would be injected into the drain of transistor 18 except if process or temperature conditions tended to increase threshold voltages $V_{TP}$ and $V_{TN}$. Under such circumstance, $I_2$ would turn OFF, which would decrease the trip point reference $V_{REF}$.

Alternatively, in trip point detector circuit $12_d$ illustrated in FIG. 13, the gate terminals of transistors 38 and 40 may be coupled to $X_{SLOW}$ (i.e., the logical inverse of SLOW) and SLOW, respectively, and transistor 18F may be fabricated to have a lower nominal threshold voltage $V_{TNL}$ than the threshold voltage $V_{TN}$ of transistor 18. Thus, for nominal or fast processes, or nominal or high temperatures, $X_{SLOW}$ is HIGH, SLOW is LOW, the drain of transistor 18 is coupled to node $X_{HI}$, and transistor 18F is effectively disconnected from the rest of the circuit. In contrast, for slow processes or low temperatures, $X_{SLOW}$ is LOW, SLOW is HIGH, the drain of transistor 18F is coupled to node $X_{HI}$, and transistor 18 is effectively disconnected from the rest of the circuit. Thus, for slow processes or low temperatures, trip point detector circuit 12d swaps nominal threshold transistor 18 with high threshold transistor 18F, which would decrease the trip point reference $V_{REF}$.

The foregoing merely illustrates the principles of this invention, and various modifications can be made by persons of ordinary skill in the art without departing from the scope and spirit of this invention.

The invention claimed is:

1. A trip point detector circuit that receives an input signal at an input signal node and generates an output signal at an output signal node, the output signal changing from a first value to a second value when the input signal exceeds a trip point reference value, the trip point detector circuit comprising:
   a circuit element comprising means for adjusting the trip point reference value to compensate for variations in process or temperature, wherein the circuit element is effectively disconnected from the trip point detector circuit except under predetermined process or temperature conditions.

2. The trip point detector circuit of claim 1, wherein the circuit element comprises means for increasing the trip point reference value.

3. The trip point detector circuit of claim 1, wherein the circuit element comprises means for decreasing the trip point reference value.

4. The trip point detector circuit of claim 1, wherein the circuit element means comprises means for adjusting the trip point reference value based on a value of a transistor threshold voltage.

5. The trip point detector circuit of claim 1, wherein the circuit element comprises a controlled current source.

6. The trip point detector circuit of claim 5, wherein the controlled current source conducts a current that varies based on process and temperature conditions.

7. The trip point detector circuit of claim 5, wherein the controlled current source comprises a transistor.

8. The trip point detector circuit of claim 5, wherein the controlled current source comprises a depletion-mode transistor.

9. A trip point detector circuit that receives an input signal at an input signal node and generates an output signal at an output signal node, the output signal changing from a first value to a second value when the input signal exceeds a trip point reference value, the trip point detector circuit comprising:
   a first transistor coupled between the input signal node and an internal node;
   a second transistor coupled between the internal node and the output signal node; and
   a controlled current source coupled to the internal signal node, the controlled current source comprising means for adjusting the trip point reference value to compensate for variations in process or temperature, wherein the controlled current source is effectively disconnected from the trip point detector circuit except under predetermined process or temperature conditions.

10. The trip point detector circuit of claim 9, wherein the controlled current source comprises means for increasing the trip point reference value.

11. The trip point detector circuit of claim 9, wherein the controlled current source comprises means for decreasing the trip point reference value.

12. The trip point detector circuit of claim 9, wherein the controlled current source comprises means for adjusting the trip point reference value based on a value of a transistor threshold voltage.

13. The trip point detector circuit of claim 9, wherein the controlled current source comprises a transistor.

14. The trip point detector circuit of claim 9, wherein the controlled current source comprises a depletion-mode transistor.

15. A trip point detector circuit that receives an input signal at an input signal node and generates an output signal at an output signal node, the output signal changing from a first value to a second value when the input signal exceeds a trip point reference value, the trip point detector circuit comprising:
 a first transistor coupled between the input signal node and an internal node;
 a second transistor coupled between the internal node and the output signal node; and
 a controlled current source coupled to the output signal node, the controlled current source comprising means for adjusting the trip point reference value to compensate for variations in process or temperature, wherein the controlled current source is effectively disconnected from the trip point detector circuit except under predetermined process or temperature conditions.

16. The trip point detector circuit of claim 15, wherein the controlled current source comprises means for increasing the trip point reference value.

17. The trip point detector circuit of claim 15, wherein the controlled current source comprises means for decreasing the trip point reference value.

18. The trip point detector circuit of claim 15, wherein the controlled current source comprises means for adjusting the trip point reference value based on a value of a transistor threshold voltage.

19. The trip point detector circuit of claim 15, wherein the controlled current source comprises a transistor.

20. A trip point detector circuit that receives an input signal at an input signal node and generates an output signal at an output signal node, the output signal changing from a first value to a second value when the input signal exceeds a trip point reference value, the trip point detector circuit comprising:
 a control circuit that generates a control signal that has a first value under first predetermined process or temperature conditions, and has a second value under second predetermined process or temperature conditions; and
 a circuit element comprising means for adjusting the trip point reference value to compensate for variations in process or temperature based on the control signal value, wherein the circuit element is effectively disconnected from the trip point detector circuit when the control signal has the second value.

21. The trip point detector circuit of claim 20, wherein the control circuit comprises a PNP transistor.

22. The trip point detector circuit of claim 20, wherein the control circuit comprises a VBE detector.

23. The trip point detector circuit of claim 20, wherein the control circuit generates the control signal based on a transistor base-emitter voltage.

24. The trip point detector circuit of claim 20, wherein the control circuit comprises a transistor that generates the control signal based a transistor base-emitter voltage.

25. The trip point detector circuit of claim 20, wherein the control circuit generates the control signal based on n-process and temperature conditions.

26. The trip point detector circuit of claim 20, wherein the control circuit generates the control signal based on p-process and temperature conditions.

27. A trip point detector circuit that receives an input signal at an input signal node and generates an output signal at an output signal node, the output signal changing from a first value to a second value when the input signal exceeds a trip point reference value, the trip point detector circuit comprising:
 first and second circuit elements comprising means for adjusting the trip point reference value to compensate for variations in process or temperature, wherein the first and second circuit elements conduct substantially no current except under predetermined process or temperature conditions.

28. The trip point detector circuit of claim 27, wherein the first and second circuit elements comprise means for increasing the trip point reference value.

29. The trip point detector circuit of claim 27, wherein the first and second circuit elements comprise means for decreasing the trip point reference value.

30. The trip point detector circuit of claim 27, wherein the first and second circuit elements comprise means for adjusting the trip point reference value based on values of transistor threshold voltages.

31. The trip point detector circuit of claim 27, wherein the first and second circuit elements each comprise a controlled current source.

32. The trip point detector circuit of claim 31, wherein each controlled current source conducts a current that varies based on process and temperature conditions.

33. The trip point detector circuit of claim 31, wherein each controlled current source comprises a transistor.

34. The trip point detector circuit of claim 31, wherein the first circuit element comprises a depletion-mode transistor.

35. A trip point detector circuit that receives an input signal at an input signal node and generates an output signal at an output signal node, the output signal changing from a first value to a second value when the input signal exceeds a trip point reference value, the trip point detector circuit comprising:
 a first transistor having a first threshold voltage;
 a second transistor having a second threshold voltage; and
 a means for switching between the first and second transistors to adjust the trip point reference value to compensate for variations in process or temperature such that the first and second transistors conduct substantially no current except under predetermined process or temperature conditions.

36. The trip point detector circuit of claim 35, wherein the first threshold voltage is lower than the second threshold voltage.

37. The trip point detector circuit of claim 35, wherein the means for switching comprises third and fourth transistors.

38. The trip point detector circuit of claim 35, wherein the means for switching effectively disconnects the first transistor or the second transistor from the trip point detector circuit based on process and temperature conditions.

39. The trip point detector circuit of claim 35, wherein a dimension of the second transistor is set relative to a dimension of the first transistor so that the second threshold voltage is higher than the first threshold voltage.

* * * * *